(12) United States Patent
Smith et al.

(10) Patent No.: US 10,316,408 B2
(45) Date of Patent: Jun. 11, 2019

(54) DELIVERY DEVICE, MANUFACTURING SYSTEM AND PROCESS OF MANUFACTURING

(71) Applicants: SILCOTEK CORP., Bellefonte, PA (US); AIXTRON SE, Herzogenrath (DE)

(72) Inventors: David A. Smith, Bellefonte, PA (US); Min Yuan, State College, PA (US); James B. Mattzela, Port Matilda, PA (US); Olaf Martin Wurzinger, Ubach-Palenberg (DE); Dietmar Keiper, Aachen (DE); Anna Katharina Haab, Wurselen (DE)

(73) Assignees: SilcoTek Corp., Bellefonte, PA (US); AIXTRON SE, Herzogenrath (DE)

( * ) Notice: Subject to any disclaimer, the term of this patent is extended or adjusted under 35 U.S.C. 154(b) by 42 days.

(21) Appl. No.: 14/946,115

(22) Filed: Nov. 19, 2015

(65) Prior Publication Data
US 2016/0168697 A1    Jun. 16, 2016

Related U.S. Application Data

(60) Provisional application No. 62/090,940, filed on Dec. 12, 2014.

(51) Int. Cl.
*C23C 16/24* (2006.01)
*C23C 16/44* (2006.01)

(52) U.S. Cl.
CPC .............. *C23C 16/44* (2013.01); *C23C 16/24* (2013.01); *C23C 16/4402* (2013.01); *C23C 16/4404* (2013.01)

(58) Field of Classification Search
CPC ................................................ C23C 16/4404
See application file for complete search history.

(56) References Cited

U.S. PATENT DOCUMENTS

| | | |
|---|---|---|
| 4,173,661 A | 11/1979 | Bourdon |
| 4,579,752 A | 4/1986 | Dubois et al. |
| 4,671,997 A | 6/1987 | Galasso et al. |
| 4,714,632 A | 12/1987 | Cabrera et al. |
| 4,741,964 A | 5/1988 | Haller |
| 4,749,631 A | 6/1988 | Haluska et al. |
| 4,753,856 A | 6/1988 | Haluska et al. |
| 4,792,460 A | 12/1988 | Chu et al. |

(Continued)

OTHER PUBLICATIONS

J. Choi et al., "Self-Assembled Monolayers as Lubricants for Magnetic Disk Drives," IEEE Transactions on Magnetics, vol. 41, No. 2, Feb. 2005, pp. 599-603.

(Continued)

*Primary Examiner* — Kelly M Gambetta
(74) *Attorney, Agent, or Firm* — McNees Wallace & Nurick LLC

(57) ABSTRACT

A delivery device, manufacturing system, and process of manufacturing are disclosed. The delivery device includes a feed tube and a chemical vapor deposition coating applied over an inner surface of the feed tube, the chemical vapor deposition coating being formed from decomposition of dimethylsilane. The manufacturing system includes the delivery device and a chamber in selective fluid communication with the delivery device. The process of manufacturing uses the manufacturing system to produce an article.

18 Claims, 3 Drawing Sheets

(56) References Cited

U.S. PATENT DOCUMENTS

| | | | |
|---|---|---|---|
| 4,842,888 | A | 6/1989 | Haluska et al. |
| 5,160,544 | A | 11/1992 | Garg et al. |
| 5,250,451 | A | 10/1993 | Chouan |
| 5,299,731 | A | 4/1994 | Liyanage et al. |
| 5,480,677 | A | 1/1996 | Li et al. |
| 5,481,135 | A | 1/1996 | Chandra et al. |
| 5,562,952 | A | 10/1996 | Nakahigashi et al. |
| 5,563,102 | A | 10/1996 | Michael |
| 5,818,071 | A | 10/1998 | Loboda et al. |
| 5,825,078 | A | 10/1998 | Michael |
| 6,159,871 | A | 12/2000 | Loboda et al. |
| 6,280,834 | B1 | 8/2001 | Veerasamy et al. |
| 6,312,808 | B1 | 11/2001 | Veerasamy et al. |
| 6,416,816 | B2 | 7/2002 | Veerasamy et al. |
| 6,444,326 | B1 | 9/2002 | Smith |
| 6,472,076 | B1 | 10/2002 | Hacker |
| 6,511,760 | B1 | 1/2003 | Barone et al. |
| 6,531,182 | B2 | 3/2003 | Veerasamy et al. |
| 6,531,398 | B1 | 3/2003 | Gaillard et al. |
| 6,593,655 | B1 | 7/2003 | Loboda et al. |
| 7,070,833 | B2 | 7/2006 | Smith et al. |
| 7,867,627 | B2 | 1/2011 | Smith et al. |
| 8,286,571 | B2 | 10/2012 | Driver et al. |
| 2004/0037956 | A1 | 2/2004 | Yang |
| 2004/0175579 | A1 | 9/2004 | Smith et al. |
| 2005/0221020 | A1* | 10/2005 | Fukiage .............. C23C 16/4404 427/569 |
| 2006/0216952 | A1 | 9/2006 | Bhanap et al. |
| 2010/0025370 | A1* | 2/2010 | Dieguez-Campo ......................... H01J 37/3244 216/67 |
| 2012/0251721 | A1* | 10/2012 | Matsumoto ............. C23C 16/40 427/248.1 |
| 2012/0251797 | A1* | 10/2012 | Smith .................. C23C 16/325 428/195.1 |
| 2013/0244025 | A1 | 9/2013 | Smith et al. |
| 2014/0370300 | A1 | 12/2014 | Smith |
| 2015/0030885 | A1 | 1/2015 | Smith |
| 2015/0147482 | A1* | 5/2015 | Kang ................ C23C 16/45525 427/535 |
| 2015/0283307 | A1 | 10/2015 | Smith et al. |

OTHER PUBLICATIONS

J. Choi, et al. "Self-Assembled Monolayer on Diamond-like Carbon Surface: Formation and Friction Measurements," Tribology International 36, 2003. pp. 285-290.

Restek Performance Coatings Service Through Technology, www.restekcorp.com, 2003, 1 p.

D.A. Smith, D. Shelow and G. Barone, "Instrument and Sampling Equipment Passivation Requirements to Meet Current Demands for Low-Level Sulfur Analysis," 2001, 37 pgs.

Fast Facts At-a-Glance Product Information from Restek, Silcosteel-UHV, Dramatically Reduce Outgassing in UHV Systems, www.restekcorp.com, 2001, 2 pgs.

Fast Facts At-a-Glance Product Information from Restek, Silcosteel-CR, Achieve Specialty Alloy Performance Using Austenitic Stainless Steels, www.restekcorp.com, 2004, 4 pgs.

D.A. Smith, G.B. Stidsen, B. Burger and D. Shelow, "The Containment and Transfer of Trace Sulfur Gases at Low-PPBV Levels," 2001, 37 pgs.

G.A. Barone, D.A. Smith and M. Higgins, "Anti-Corrosive and Anti-Coking Properties of Unique Surface Coatings or Metal Substrates in Petrochemical Service," www.restekcorp.com, obtained Feb. 2015, 19 pgs.

G.A. Barone, D.A. Smith and D. Shelow, "Advantages to Using Inert, Coated Components for Sampling & Measurement of Organo-Sulfur Compounds," www.restekcorp.com, obtained Feb. 2015, 17 pgs.

R.L. Firor and B.D. Quimby, "Dual-Channel Gas Chromatographic System for the Determination of Low-Level Sulfur in Hydrocarbon Gases," Agilent Technologies, Inc., Mar. 2003, 10 pgs.

R.L. Firor, "Use of GC/MSD for Determination of Volatile Sulfur: Application in Natural Gas Fuel Cell Systems and Other Gaseous Streams," Agilent Technologies, Inc., Nov. 2001, 10 pgs.

V. Pretorius and J.D. Du Toit, "Gas Chromatography in Glass and Fused Silica Capillary Columns: Deactivation of the Inner Surface Using Silicon Films," Journal of HRC & CC, 1981, 2 pgs.

D.A. Smith, M. Higgins and G. Barone, "Evaluation of System Surfaces in Low-Level Sulfur Analysis for the Petrochemical Industry," www.restekcorp.com, obtained Feb. 2015, 37 pgs.

G. Barone, D.Smith and M. Higgins, "Selection of Surface Coatings for Process Lines and Equipment Used in Corrosive and Reactive Streams", Analytical Solutions for Energy Optimization & Environmental Compliance, The 54th Annual Symposium of the Analysis Division, Apr. 2009, 17 pgs.

J. De Zeeuw, G. Barone and M. Higgins, "Comparing Surface Adsorption Effects During the Analysis of Mercury and Sulfur Containing Streams," www.restekcoatings.com, obtained Feb. 2015, 30 pgs.

G. Barone, D. Smith, M. Higgins and T. Neeme, "Study of Chemical and Physical Adsorption Properties of Moisture, Sulfur, and Mercury Streams Through a Variety of Tubing Substrates," ISA 53rd Analysis Division Symposium, 2008, 9 pgs.

D.A. Smith and J.B. Mattzela, The Deposition and Functionalization of Silicon-Based Materials to Prevent Surface Corrosion, Adsorption, Contamination and Catalytic Interactions, MS&T'09, Oct. 2009, 21 pgs.

W. Bertsch and V. Pretorius, "Deactivation of Metal Surfaces for Capillary Columns for GC by Deposition of Silicon," Journal of HRC&CC, 1982, 3 pgs.

G.G. Gerhab and A. Schuyler, "Highly Inert Sample Pathways," 1996, 16 pgs.

A. Schuyler, J.W. Stauffer, C.E. Loope and C.R. Vargo, "Highly Efficient and Inert Stainless Steel GC columns: A Durable, Flexible Alternative to Fused Silica," Elsevier Science Publishers, 1992, 6 pgs.

G. Gerhab and A. Schuyler, "Efficient and Rapid GC Analysis With Rugged Metal Microbore Capillary Columns," www.restekcorp.com, obtained Feb. 2015, 18 pgs.

J. De Zeeuw, "Deactivation of Metal Surfaces: Applications in Gas Chromatography (GC) for the Past 15 Years," American Laboratory, Nov. 2012, 10 pgs.

"Silicon Nitride for MEMS Applications: LPCVD and PECVD Process Comparison" (Plasma-Therm, Jul. 2014).

"Review—Silicon Nitride and Silicon Nitride-Rich Thin Film Technologies: Trends in Deposition Techniques and Related Applications" (ECS Journal of Solid State Science and Technology, 6 (10) p. 691-p. 714 (2017)).

"LPCVD and PECVD Silicon Nitride for Microelectronics Technology" (Indian Journal of Engineering & Material Sciences, vol. 7, Oct.-Dec. 2000, pp. 303-309).

* cited by examiner

DELIVERY DEVICE, MANUFACTURING SYSTEM AND PROCESS OF MANUFACTURING

FIELD OF THE INVENTION

The present invention is directed to delivery devices, manufacturing systems, and processes of manufacturing. More particularly, the present invention is directed to a delivery device for producing organic light emitting diodes.

BACKGROUND OF THE INVENTION

Organic Light Emitting Diodes (OLED) are light emitting diodes (LED) with an organic film which forms an emissive electroluminescent layer that emits light in response to an electric current. Currently, OLEDs are being developed for use in display and lighting technology, and are generally considered to provide the highest resolution and most extreme contrast displays possible. OLEDs are also incorporated into high resolution flexible display technology and high efficiency, unique conformation lighting systems.

One common method for producing OLEDs for display technology includes depositing an organic film through spray coating. A typical manufacturing system includes multiple feeds for spray applying organic films that provide pixel coloring. However, these manufacturing systems often include metal surfaces that do not include desired performance characteristics. The failure to include specific desired performance characteristics can result in decreased yield, an inability to meet certain performance requirements, increased manufacturing costs, or combinations thereof.

In particular, the metal surfaces within the manufacturing system can be subjected to undesirable surface activities such as chemical adsorption, catalytic activity, corrosive attack, oxidation, reagent retention/carryover, stiction, and/or other undesirable surface activities. Due to the undesirable surface activities, the organic films and/or the coloring can build up in the feed tubes of the manufacturing system. The build-up of organic films and/or coloring clogs the feed tubes, which requires cleaning of the tubes, decreases yield, and increases cost. In addition, the build-up of organic films and/or coloring can introduce cross-contamination in subsequent coating applications, which can change the pixel coloring and introduce errors in the manufacturing process.

A delivery device, manufacturing system, and process of manufacturing that show one or more improvements in comparison to the prior art would be desirable in the art.

BRIEF DESCRIPTION OF THE INVENTION

In an embodiment, a delivery device includes a feed tube and a chemical vapor deposition coating applied over an inner surface of the feed tube, the chemical vapor deposition coating being formed from decomposition of dimethylsilane.

In another embodiment, a manufacturing system includes a delivery device having a feed tube, a chemical vapor deposition coating applied over an inner surface of the feed tube, the chemical vapor deposition coating being formed from decomposition of dimethylsilane. The system also includes a chamber in selective fluid communication with the delivery device.

In another embodiment, a process of manufacturing an article includes providing a component, the component including a chemical vapor deposition coating applied over a surface thereof, the chemical vapor deposition coating being formed from decomposition of dimethylsilane, and transporting a material over the surface including the chemical vapor deposition coating. The component is selected from the group consisting of a feed tube, an ultra-high vacuum (UHV) component, a shower head, a deflector plate, a fitting, and combinations thereof.

Other features and advantages of the present invention will be apparent from the following more detailed description, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided are a delivery device, a manufacturing system, and a process of manufacturing. Embodiments of the present disclosure, for example, in comparison to concepts failing to include one or more of the features disclosed herein, decrease cross-contamination during coating, increase coating efficiency, increase yield, decrease coating errors, decrease process cost, decrease reagent retention/carryover within feed tubes of the manufacturing system, decrease stiction within the feed tubes, or permit a combination thereof.

Figure 1:
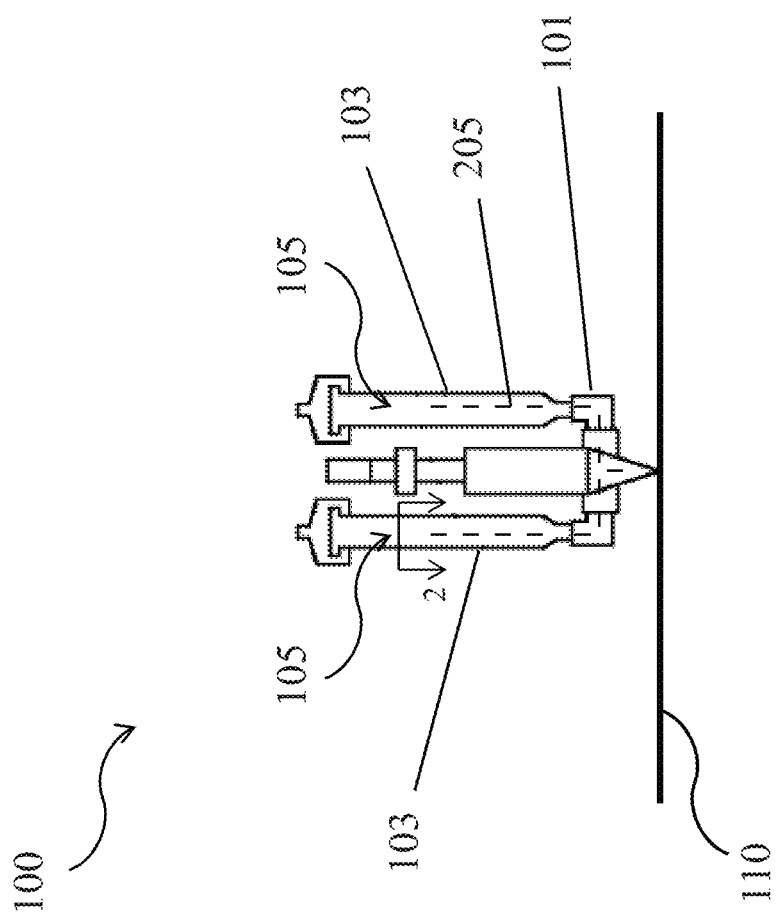
FIG. 1 shows a perspective view of a portion of manufacturing system.

Referring to FIG. 1, in one embodiment, an organic light emitting diode (OLED) manufacturing system 100 includes a delivery device 101, a processing material 105, and a substrate 110. The delivery device 101 includes any suitable device for applying the processing material 105 to the substrate 110, such as, but not limited to, a spray mechanism (FIG. 1), a printing nozzle, a deposition mechanism, or a combination thereof. The processing material 105 includes any material used during production of the OLED, such as coloring material, organic material, OLED coating material, or a combination thereof. The substrate 110 includes any material for forming an OLED.

At least one feed tube 103 is within and/or coupled to the delivery device 101, each of the at least one feed tubes 103 configured to house and/or transport the processing material 105. During operation of the OLED manufacturing system 100, one or more feed tubes 103 supply the processing material 105 to the delivery device 101, which directs the processing material 105 toward the substrate 110, positioned within a chamber (not shown) or other region configured to received the processing material 105 and/or to position an article to be manufactured. The feed tubes 103 and the delivery device 101 form a portion of a manufacturing flowpath 115 of the OLED manufacturing system 100. As used herein, the term "manufacturing flowpath" refers to any surface of the OLED manufacturing system 100 which is contacted by the processing material 105. Other surfaces that form a portion of the manufacturing flowpath 205 include, but are not limited to, any surface that connects the feed tube 103 to the delivery device 101, an inner surface of any component that provides the processing material 105 to the feed tube 103, and/or an inner surface of any additional component through which the organic material 105 is transported prior to being applied to the substrate 110.

Figure 2:
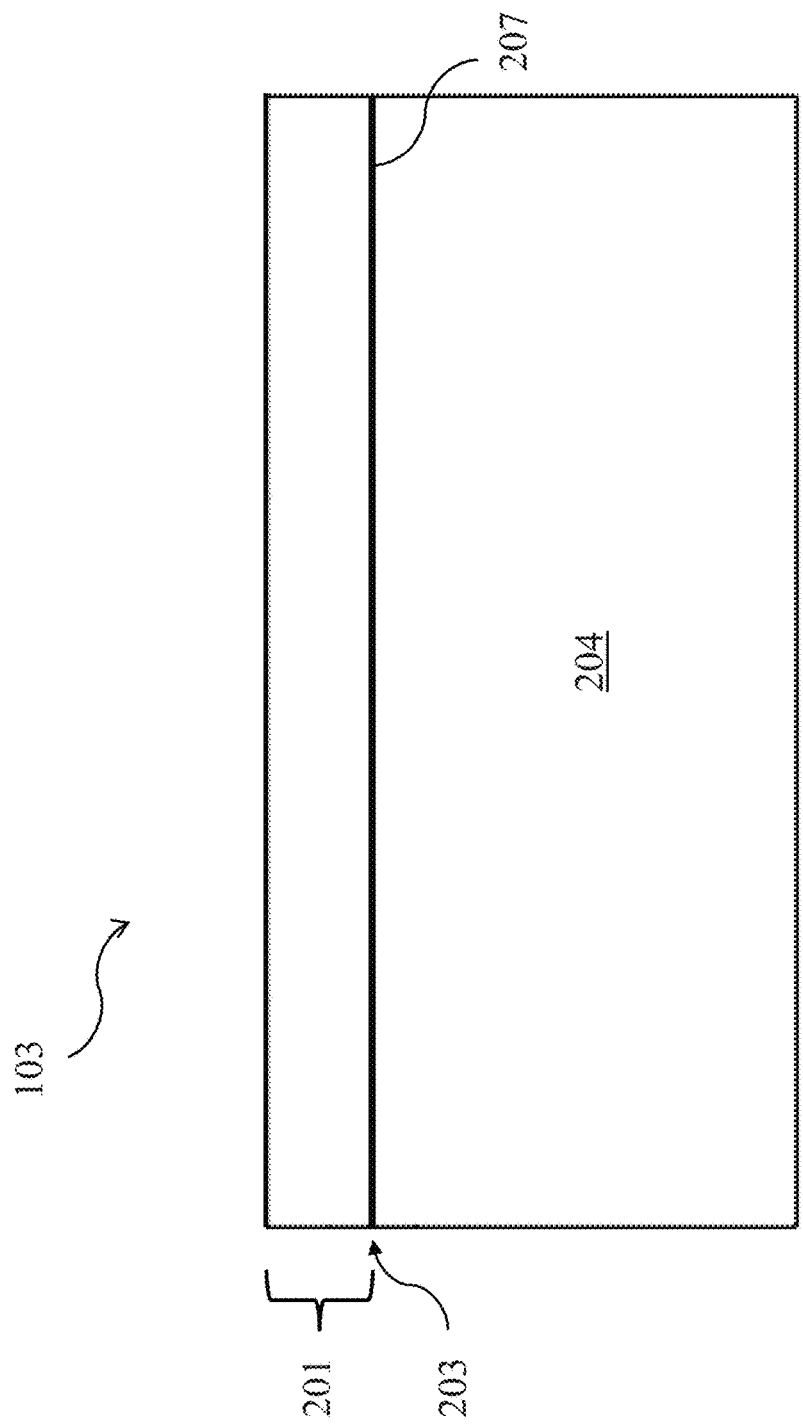
FIG. 2 shows a schematic view of a portion of a cross section view of a feed tube, according to an embodiment of the disclosure.

As illustrated in FIG. 2, a coating 201 is applied over a surface 203 of any suitable substrate 204 in the manufacturing flowpath 205 (FIG. 1). Suitable substrates include any metallic substrate, such as, but not limited to, pure or substantially pure metals (for example, aluminum and platinum), metal alloys (for example, stainless steel, aluminum-based alloys, and nickel-based alloys), impure metals or impure metal alloys (for example, 95 weight % aluminum-containing metals, 98 weight % aluminum-containing metals, and 95 weight % nickel-containing metals), metal-coated substrates (for example, tantalum-coated), or a combination thereof. For example, in one embodiment, the coating 201 is applied over an inner surface 207 of the feed tube 103. Although shown with respect to the inner surface 207 of the feed tube 103, as will be understood by those skilled in the art, the disclosure is not so limited and is intended to cover application of the coating 201 to the surface 203 of any other article or component including a suitable substrate. Other articles or components with suitable substrates include, but are not limited to, other components in the manufacturing flowpath 115, other components within the OLED manufacturing system 100, components not forming a portion of the OLED manufacturing system 100, or a combination thereof. Components not forming a portion of the OLED manufacturing system 100 include, for example, ultra-high vacuum (UHV) components, shower heads, deflector plates, fittings, or a combination thereof.

The coating 201 is formed from decomposition of a silane material, such as, but not limited to, dimethylsilane, trimethylsilane, or a combination thereof. As disclosed in U.S. patent application Ser. No. 13/876,328, and U.S. patent application Ser. No. 13/504,533, both of which are incorporated herein by reference in their entirety, a process for forming the coating 201 includes chemical vapor deposition (CVD) of dimethylsilane. The chemical vapor deposition is by thermal application and not plasma-assisted methods.

In one embodiment, forming the coating 201 over the surface 203 of the substrate 204 through CVD includes thermally decomposing dimethylsilane and/or any other suitable thermal decomposition gas and depositing amorphous carbosilane. In general, suitable species of the decomposition gas include, but are not limited to, an organosilane, dimethylsilane, any silane gas, or any other suitable chemical vapor deposition gas. Other suitable materials for the introducing and/or subsequent treatment include, but are not limited to, silane, trimethylsilane, dialkylsilyl dihydride, alkylsilyl trihydride, dialkylsilyl dihydride, alkylsilyl trihydride, organofluorotrialkoxysilanes, and/or organofluorosilylhydrides.

Any portion of the chemical vapor deposition process is capable of being preceded or followed by selectively applying a purge gas to the chemical vapor deposition chamber through introduction of the purge gas to the chemical vapor deposition chamber. The purge gas is nitrogen, helium, argon, or any other suitable inert gas. The purging is in one purge cycle, two purge cycles, three purge cycles, more than three purge cycles, or any suitable number of purge cycles that permits chemical vapor deposition chamber to be a chemically inert environment. For example, in one embodiment, after the purging, the decomposition gas is introduced at a sub-decomposition temperature that is below the thermal decomposition temperature of the decomposition gas. As used herein, the phrase "sub-decomposition temperature" refers to conditions at which the decomposition gas will not thermally decompose.

In one embodiment, prior to forming the coating 201, the substrate 204 is modified to receive a CVD coating. Modifying the substrate 204 includes any suitable treatment method. For example, modifying the substrate 204 is capable of including isolating the substrate 204 in a chemical vapor deposition chamber, preheating the substrate 204, flushing the chamber with an inert gas, and evacuating the chamber.

Isolating the substrate 204 is performed in an inert atmosphere within the chamber. The flow of gas and/or maintenance of a vacuum in the chamber is capable of providing the controlled atmosphere. A heat source is capable of controlling the temperature in the chamber to desorb water and remove remaining contaminants from the surface 203 of the substrate 204. For example, the surface 203 to be treated is capable of being included within a chemical vapor deposition chamber with tubing connections to allow gas flow in and out of the chemical vapor deposition chamber. The chamber is capable of including multiple controlled inlets and outlets configured for providing and removing multiple gas streams. A vacuum is capable of being connected to one or more outlet tubes.

Depending upon the cleanliness of the substrate 204, the metal is capable of being prepared by heating at a temperature above 100° C. and a pressure of below 1 atmosphere for a period ranging from a few minutes to 15 hours. Generally, the temperature of the heating corresponds to the properties of the substrate 204. In one embodiment, the period is from 0.5 to 15 hours. In another embodiment, the substrate 204 is heated at 450° C. for 2 hours. After preparation under vacuum, the chamber is capable of being selectively flushed with an inert gas and evacuated.

The thermal decomposition of dimethylsilane includes introducing dimethylsilane into a reaction chamber at a predetermined pressure and temperature sufficient to decompose dimethylsilane, depositing constituents from the decomposition onto the surface 203 of the substrate 204, coating the substrate 204 for a predetermined period of time to achieve a predetermined thickness, and/or purging the chamber of dimethylsilane. Although not intending to be bound by theory, it is believed that the dimethylsilane thermally decomposes to form carbosilyl fragments, which recombine and bind to the substrate 204. It is believed that the resultant coating 201 includes amorphous carbosilanes having carbon, silicon, and hydrogen on the substrate surface as well as on exposed surfaces of the chamber.

In one embodiment, at least during the introducing of the decomposition gas, the operating the chemical vapor deposition chamber is substantially devoid of catalyst (for example, being below a level that impacts the process) or devoid of catalyst (for example, being absent at detectable levels and/or being completely absent).

In one embodiment, the coating 201 is formed by cold fill deposition. Cold fill deposition includes positioning the substrate 204 in a chemical vapor deposition chamber, then operating the chemical vapor deposition chamber. The operating of the chemical vapor deposition chamber includes purging the chemical vapor deposition chamber, introducing a deposition gas to the chemical vapor deposition chamber, heating the chemical vapor deposition chamber, or a combination thereof. In addition to the advantages disclosed for the coating 201 formed through CVD, the coating 201 formed through cold fill deposition, as disclosed above, increases the number of materials upon which the coating 201 is capable of being formed. For example, using cold fill deposition, the coating 201 is capable of being formed on materials that are prone to oxidation and/or heat affect. Furthermore, the cold fill deposition of the coating 201 permits an increase in cross-link density of the coating 201.

During and/or after the introducing of the decomposition gas, in one embodiment, the operating of the chemical vapor deposition chamber includes heating the chemical vapor deposition chamber to a super-decomposition temperature that is equal to or above the thermal decomposition temperature of the decomposition gas. As used herein, the phrase "super-decomposition temperature" refers to conditions at which the decomposition gas will thermally decompose. Heating the chemical vapor deposition chamber to the super-decomposition temperature in the presence of the decomposition gas forms the coating 201 on at least the surface 203 of the substrate 204.

The heating of the chemical vapor deposition chamber is at any suitable heating rate from the sub-decomposition temperature to the super-decomposition temperature. Depending upon the species of the decomposition gas, suitable super-decomposition temperatures include, but are not limited to, between 440° C. and 460° C., greater than 460° C., greater than 450° C., greater than 460° C., greater than 480° C., greater than 500° C., or any suitable combination, sub-combination, range, or sub-range therein. Suitable heating rates include, but are not limited to, between 6° C. per minute and 10° C. per minute, between 7° C. per minute and 9° C. per minute, greater than 6° C. per minute, greater than 7° C. per minute, less than 10° C. per minute, less than 9° C. per minute, at 8° C. per minute, or any suitable combination, sub-combination, range, or sub-range therein. At such rates, in one embodiment, the heating of the chemical vapor deposition chamber is for a period of between 3 minutes and 10 minutes, a period of between 5 minutes and 10 minutes, a period of between 7 minutes and 10 minutes, a period of between 3 minutes and 7 minutes, a period of between 3 minutes and 5 minutes, or any suitable combination, sub-combination, range, or sub-range therein.

Figure 3:
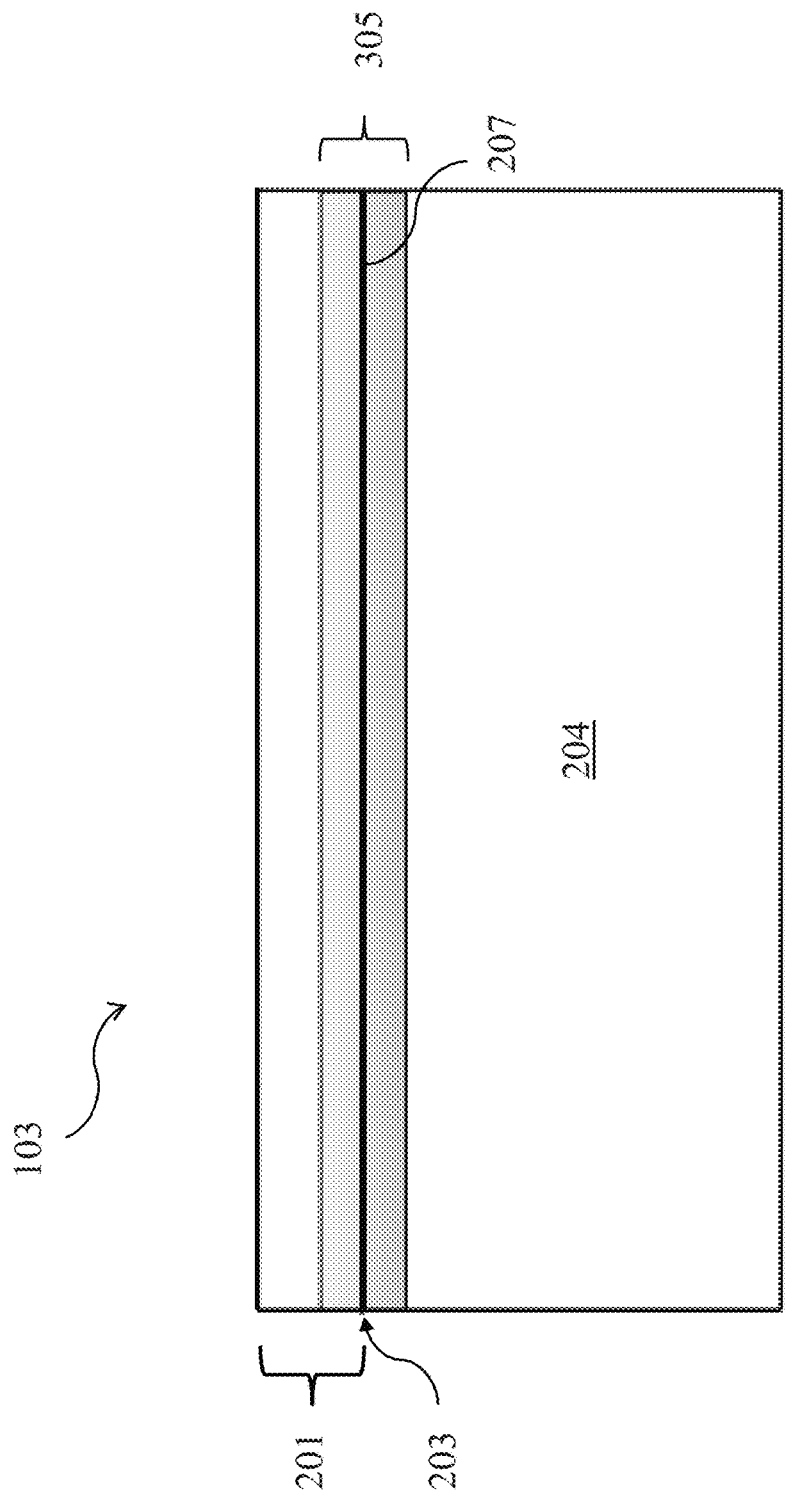
FIG. 3 shows a schematic view of a portion of a cross section view of a feed tube having a diffusion zone, according to an embodiment of the disclosure.

In one embodiment, as illustrated in FIG. 3, the deposited material diffuses into the surface 203 of the metallic substrate, forming a diffusion zone 305 extending between the substrate 204 and the coating 201. Subsequent to forming the coating 201, the chamber is capable of being purged of dimethylsilane and volatile, non-deposited carbosilyl fragments. If a thicker deposition layer is desired, deposition conditions are changed. This is accomplished by changing temperature, pressure, time, or combinations thereof. Multiple layers are also capable of being applied by repeating the introduction and thermal decomposition of the dimethylsilane.

Depending upon the decomposition gas and other parameters, suitable pressures for the decomposition is between 1.0 psia and 250 psia, between 1.0 and 200 psia, between 1.0 psia and 150 psia, between 1.0 psia and 100 psia, between 1.0 psia and 75 psia, between 1.0 psia and 50 psia, between 1.0 psia and 40 psia, between 1.0 psia and 30 psia, between 1.0 psia and 20 psia, between 1.0 psia and 10 psia, between 1.0 psia and 5.0 psia, between 5 psia and 40 psia, 1.0 psia, 5 psia, 40 psia, 100 psia, 200 psia, or any suitable combination, sub-combination, range, or sub-range therein.

Depending upon the decomposition gas and other parameters, suitable temperatures for the decomposition is less than 30° C., less than 60° C., less than 100° C., less than 150° C., less than 200° C., less than 250° C., less than 300° C., less than 350° C., less than 400° C., less than 440° C., less than 450° C., between 100° C. and 300° C., between 125° C. and 275° C., between 200° C. and 300° C., between 230° C. and 270° C., or any suitable combination, sub-combination, range, or sub-range therein.

Depending upon the decomposition gas and other parameters, suitable periods of time for the decomposition are between 10 minutes and 24 hours, between 1 hours and 10 hours, between 2 hours and 10 hours, between 4 hours and 6 hours, between 4 hours and 8 hours, at least 10 minutes, at least 1 hours, at least 4 hours, at least 10 hours, less than 10 hours, less than 8 hours, less than 6 hours, less than 4 hours, or any suitable combination, sub-combination, range, or sub-range therein.

While a thickness of the coating 201 depends on the geometry of the substrate 204 to be coated and the type of finish required, in an embodiment made according to the methods disclosed herein, the coating 201 has a thickness of between 100 nm and 10,000 nm, between 100 nm and 5,000 nm, between 200 nm and 5,000 nm, between 100 nm and 3,000 nm, between 300 nm and 1,500 nm, or any combination, sub-combination, range, or sub-range therein. In another embodiment, the diffusion zone 305 is between 5 nm and 500 nm. For example, in a further embodiment, the coating 201 extends to 130 nm and includes a portion of the diffusion zone 305, which extends 20 nm, and is identifiable based upon an increased concentration of 0 and decreased in concentration of C and Si (for example, by at least a factor of four).

In one embodiment, the coating 201 is devoid or substantially devoid of surface activity, which decreases or eliminates retention and/or build-up of the processing material 105 in the manufacturing flow path 205, as compared to the substrate 204 without the coating 201 (in addition, surface activity refers to, but is not limited to, discoloration, for example, to produce a blue or purple appearance). By decreasing or eliminating retention and/or build-up of the processing material 105, the coating 201 decreases or eliminates-cross contamination issues associated with current OLED manufacturing systems. Additionally, by decreasing or eliminating retention and/or build-up of the processing material 105, the coating 201 decreases cleaning time, increases manufacturing efficiency, provides pure production of OLED displays, increases manufacturing yield, and/or decreases manufacturing cost.

Any other suitable treating steps are performed on the coating 201 after the decomposition gas is introduced. The treating of the coating 201 includes, for example, heating and/or modifying the coating 201 applied over the substrate 204. In one embodiment, the treating includes exposure of the substrate 204 and/or the coating 201 to a suitable organosilane reagent. One suitable organosilane reagent is a trifunctional organosilane that consists of the general formula RR'R"Si—H, where R,R',R" are organofunctional groups. Examples of the organofunctional groups are alkyl, aryl, halogenated alkyl and aryl, ketones, aldehydes, acyl, alcohol, epoxy, and nitro—organo groups, and organometallic functionalities. In one embodiment, the organosilane is trimethylsilane.

By modifying and varying the R' groups, or by using other molecules capable of hydroxyl reactivity, surface properties of the treated coating (for example, the air-oxidized carboxysilane layer) are adjusted. For example, in one embodiment, the adjustments increase or decrease hardness and wear resistance, inertness, stiction, coking, contact angle, and combinations thereof. In another embodiment, adjusting the coating 201 to decrease stiction and/or provide anti-stiction properties decreases or eliminates adhesion, retention, carryover, contamination, and/or build-up of the processing material 105 in the manufacturing flowpath 205, as compared to the uncoated surface 203 of the substrate 204. By decreasing or eliminating adhesion, retention, carryover, contamination, and/or build-up of the processing material 105 in the manufacturing flowpath 205, the coating 201 decreases or eliminates cross-contamination of the processing materials 105, decreases manufacturing errors, decreases cleaning time, increases OLED manufacturing efficiency, and/or decreases manufacturing cost.

In one embodiment, the CVD of the dimethylsilane is followed by oxidation to form a carboxysilane and/or functionalization to form a functionalized carboxysilane. Oxidation of the coating 201 includes exposure to any suitable chemical species capable of donating a reactive oxygen species into the coating 201 under predetermined oxidation conditions. In general, oxidation is a bulk reaction that affects the bulk of the coating 201. The oxidation improves hardness and/or wear resistance of carbosilane and functionalized carbosilane-based chemical vapor deposition process materials on the surface 203 of the substrate 204. The oxidation is capable of being controlled by increasing or decreasing the temperature within the chamber, the exposure time within the chamber, the type and/or amount of diluent gases, pressure, and/or other suitable process conditions. Control of the oxidation is capable of increasing or decreasing the amount and/or depth of oxidation and, thus, the wear resistance and/or hardness of the surface.

The chemical species for the oxidation of the coating 201 are selected based upon the desired properties of the coating 201. Suitable chemical species for the oxidation of the coating 201 include, for example, water, oxygen, air, nitrous oxide, ozone, peroxide, and combinations thereof. In one embodiment, the coating 201 is oxidized with water as an oxidizing agent (for example, within a temperature range of 100° C. to 600° C., a temperature range of 300° C. to 600° C., or at a temperature of 450° C.). In this embodiment, the oxidizing lowers friction (in comparison to using an oxidizing reagent of air and water), decreases wear resistance (for example, in comparison to using an oxidizing reagent of air and water), and forms Si—O—Si groups. The Si—O—Si groups formed in this embodiment is capable of further decreasing or eliminating surface activity of the coating 201 with respect to the processing material 105. In another embodiment, the coating 201 is oxidized with an oxidizing reagent including air and water (for example, within a temperature range of 100° C. to 600° C., a temperature range of 300° C. to 600° C., or at a temperature of 450° C.). In this embodiment, the oxidizing over-oxidizes and decreases an amount of C—H groups (for example, in comparison to using water alone as an oxidizing reagent), decreases an amount of Si—C groups (for example, in comparison to using water alone as an oxidizing reagent), and increases an amount of Si—OH/C—OH groups (for example, in comparison to using water alone as an oxidizing reagent). Depending on the processing material 105, the decreased amount of C—H and Si—C groups, and/or the increased amount of Si—OH/C—OH groups are capable of further decreasing or eliminating surface activity of the coating 201. In an alternate embodiment, the coating 201 is oxidized with air (only) (for example, within a temperature range of 100° C. to 600° C., a temperature range of 300° C. to 600° C., or at a temperature of 450° C.). In this embodiment, the oxidizing lowers friction, increases wear resistance (for example, in comparison to using an oxidizing reagent of water), and forms Si—O—Si and Si—OH groups. The lowered friction and increased wear resistance is capable of increasing efficiency of the OLED manufacturing system 100 including the coating 201, and/or the Si—O—Si and Si—OH groups is capable of further decreasing or eliminating surface activity of the coating 201.

In one embodiment, after forming the coating 201 on the surface 203 of the substrate 204, the coating 201 is treated by trimethylsilane. In another embodiment, the coating 201 is oxidized to form the carboxysilane prior to treatment by trimethylsilane. In a further embodiment, after treating the carboxysilane with trimethylsilane, the coating 201 is functionalized. Treatment with the trimethylsilane is capable of providing improvements over untreated oxidized and/or functionalized coatings in inertness, corrosion resistance, hydrophobicity, pH resistance, wear resistance and hardness, and combinations thereof. Additionally or alternatively, the coating 201 is capable of being adjusted for anti-stiction and anti-coking properties.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A delivery device, comprising:
   a feed tube; and
   a chemical vapor deposition coating applied over an inner surface of the feed tube, the chemical vapor deposition coating being formed from thermal decomposition of dimethylsilane, the chemical vapor deposition coating includes amorphous carbosilanes having carbon, silicon, and hydrogen;
   wherein the chemical vapor deposition coating is applied under conditions of between 1.0 psia and 200 psia and between 200° C. and 600° C.

2. The delivery device of claim 1, wherein the chemical vapor deposition coating is applied under conditions of between 1.0 psia and 10 psia.

3. The delivery device of claim 1, wherein the chemical vapor deposition coating is applied under conditions of between 400° C. and 500° C.

4. The delivery device of claim 1, wherein the chemical vapor deposition coating is applied for between 10 minutes and 24 hours.

5. The delivery device of claim 1, wherein the chemical vapor deposition coating is applied for between 4 hours and 6 hours.

6. The delivery device of claim 1, wherein the delivery device is positioned within an organic light emitting diode manufacturing system.

7. The delivery device of claim 1, further comprising a processing material contained within the feed tube.

8. The delivery device of claim 7, wherein the delivery device is arranged and disposed to direct the processing material towards a substrate to be coated.

9. The delivery device of claim 7, wherein the processing material is an organic material.

10. The delivery device of claim 1, wherein the chemical vapor deposition coating is oxidized.

11. The delivery device of claim 1, wherein the chemical vapor deposition coating is functionalized.

12. The delivery device of claim 1, wherein the chemical vapor deposition coating is treated with trimethylsilane.

13. The delivery device of claim 1, wherein the inner surface is a pure or substantially pure metal surface.

14. The delivery device of claim 1, wherein the inner surface is a metal alloy surface.

15. The delivery device of claim 1, wherein the inner surface is an impure metal surface.

16. The manufacturing system of claim 1, further comprising additional feed tubes.

17. A manufacturing system, comprising:
- a delivery device having a feed tube, a chemical vapor deposition coating applied over an inner surface of the feed tube, the chemical vapor deposition coating being formed from thermal decomposition of dimethylsilane, the chemical vapor deposition coating includes amorphous carbosilanes having carbon, silicon, and hydrogen; and
- a chamber in selective fluid communication with the delivery device;

wherein the chemical vapor deposition coating is applied under conditions of between 1.0 psia and 200 psia and between 200° C. and 600° C. and the chemical vapor deposition coating is oxidized.

18. A delivery device, comprising:
- a feed tube; and
- a chemical vapor deposition coating applied over an inner surface of the feed tube, the chemical vapor deposition coating being formed from thermal decomposition of dimethylsilane, the inner surface being a metal alloy surface, the chemical vapor deposition coating includes amorphous carbosilanes having carbon, silicon, and hydrogen; and
- a processing material contained within the feed tube, the processing material being an organic material;

wherein the delivery device is arranged and disposed to direct the processing material towards a substrate to be coated;

wherein the chemical vapor deposition coating is applied under conditions of between 1.0 psia and 200 psia and between 200° C. and 600° C. and the chemical vapor deposition coating is oxidized.

* * * * *